United States Patent
Matsuura et al.

(10) Patent No.: US 10,199,545 B2
(45) Date of Patent: Feb. 5, 2019

(54) SUBSTRATE FOR LIGHT EMITTING ELEMENT AND MODULE

(71) Applicants: Dai Nippon Printing Co., Ltd., Tokyo (JP); NICHIA CORPORATION, Anan-shi (JP)

(72) Inventors: Daisuke Matsuura, Tokyo (JP); Takayuki Komai, Tokyo (JP); Satoshi Shibasaki, Tokyo (JP); Naoto Yamanaka, Tokyo (JP); Masaaki Katsumata, Anan (JP); Tomohiro Ikeda, Anan (JP)

(73) Assignees: Dai Nippon Printing Co., Ltd., Tokyo (JP); NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/280,312

(22) Filed: Sep. 29, 2016

(65) Prior Publication Data
US 2017/0092819 A1 Mar. 30, 2017

(30) Foreign Application Priority Data
Sep. 30, 2015 (JP) .................... 2015-195495
Aug. 23, 2016 (JP) .................... 2016-162503

(51) Int. Cl.
*H01L 33/48* (2010.01)
*H01L 33/50* (2010.01)
(Continued)

(52) U.S. Cl.
CPC ............ *H01L 33/486* (2013.01); *H01L 33/60* (2013.01); *H01L 33/62* (2013.01); *H01L 25/0753* (2013.01); *H01L 33/502* (2013.01); *H01L 33/508* (2013.01); *H01L 33/56* (2013.01); *H01L 2933/0066* (2013.01)

(58) Field of Classification Search
CPC ... H01L 2924/181; H01L 33/62; H01L 33/60; H01L 2224/32225; H01L 2224/16225; H01L 33/56; H01L 2933/005
USPC ....... 257/98, 99, E33.059, E33.06, E23.003, 257/E33.001, E33.072; 438/27, 26, 106, 438/116; 362/241
See application file for complete search history.

(56) References Cited

U.S. PATENT DOCUMENTS 9,231,177 B2  1/2016 Oguro et al.
2003/0189829 A1* 10/2003 Shimizu .................... F21L 4/00
                                                          362/240
(Continued)

FOREIGN PATENT DOCUMENTS

JP  2005-244152 A  9/2005
JP  2005-259888 A  9/2005
(Continued)

*Primary Examiner* — Jonathan Han
(74) *Attorney, Agent, or Firm* — Locke Lord LLP

(57) ABSTRACT

A substrate for a light emitting element including a resin substrate exhibiting flexibility and a metal wiring portion being formed on at least one surface side of the resin substrate via an adhesive layer, in which a reflective layer composed of a thermosetting resin is disposed between the resin substrate and the adhesive layer, in which the reflective layer contains a light reflective filler at 10% by mass or more and 85% by mass or less and has a reflectance to light at a wavelength of 450 nm of 80% or more.

18 Claims, 4 Drawing Sheets

(51) Int. Cl.
    *H01L 33/56*     (2010.01)
    *H01L 33/62*     (2010.01)
    *H01L 33/60*     (2010.01)
    *H01L 25/075*     (2006.01)

(56) References Cited

U.S. PATENT DOCUMENTS

| | | |
|---|---|---|
| 2005/0247944 A1 | 11/2005 | Haque et al. |
| 2007/0228947 A1* | 10/2007 | Tanimoto .................. F21K 9/00 257/E33.059 |
| 2013/0001618 A1 | 1/2013 | Imai et al. |
| 2013/0328091 A1* | 12/2013 | Fuke ....................... H01L 33/60 257/98 |
| 2014/0061684 A1 | 3/2014 | Marutani et al. |
| 2014/0273289 A1* | 9/2014 | Omura ................ H01L 33/0095 438/4 |
| 2015/0236230 A1* | 8/2015 | Miyata .................... H01L 33/62 257/98 |
| 2015/0245476 A1* | 8/2015 | Akahane ............. H05K 1/0366 442/71 |

FOREIGN PATENT DOCUMENTS

| | | |
|---|---|---|
| JP | 2005-322937 A | 11/2005 |
| JP | 2006-100444 A | 4/2006 |
| JP | 2008-091459 A | 4/2008 |
| JP | 2012-059867 A | 3/2012 |
| JP | 2013-033909 A | 2/2013 |
| JP | 2014-078686 A | 5/2014 |
| JP | 2015-012206 A | 1/2015 |
| JP | 2015-119013 A | 6/2015 |

\* cited by examiner

SUBSTRATE FOR LIGHT EMITTING ELEMENT AND MODULE

This application is based on and claims the benefit of priority from Japanese Patent Application No. 2015-195495, filed on 30 Sep. 2015 and Japanese Patent Application No. 2016-162503, filed on 23 Aug. 2016, the content of which is incorporated herein by reference.

BACKGROUND OF THE INVENTION

Related Art

In recent years, the spread of various kinds of light emitting display devices, such as liquid crystal televisions using a light emitting element such as an LED as a backlight source, have rapidly spread as an alternative to cathode ray tube type monitors of the prior art in order to meet the demand for low power consumption, increase in size and decrease in thickness of the instrument.

In order to mount the light emitting element to these display devices as a light source, usually various kinds of substrates for light emitting elements consisting of a support substrate and a wiring portion are used. Moreover, laminates (in this specification, a laminate having such a configuration is referred to as the "module") in which a light emitting element is mounted on these substrates are widely used as a light source of the various kinds of LED display devices.

Hitherto, a rigid substrate in which a light emitting element is mounted on a rigid substrate consisting of a hard glass epoxy plate that does not exhibit flexibility or the like has been widely employed as a substrate for a light emitting element. However, in recent years during which an increase in the size of LED display devices and diversification in the form of display screens have taken place, a so-called flexible circuit board in which a metal circuit is formed on a resin substrate exhibiting flexibility has been developed (see Patent Document 1). A flexible circuit board exhibiting flexibility is expected to spread widely even further in the future since it has a higher degree of freedom with respect to design and higher productivity as compared to the rigid substrate.

However, the substrate for a light emitting element in which a light emitting element is mounted on this flexible circuit board is required to exhibit excellent light resistance to the light from the light emitting element. This is because there is a case in which the substrate for the light emitting element is degraded as it receives light from the light emitting element and holes are generated in some cases in the case of a substrate for light emitting element which exhibits low light resistance. The substrate for a light emitting element is required to exhibit particularly high light resistance particularly in the case of mounting a blue light emitting element which emits blue light having a short wavelength.

In order to cope with such a problem, a substrate for a light emitting element in which the adhesive layer to bond the metal wiring portion contains a light shielding member to shield the light from the light emitting element is disclosed in Patent Document 2. In Examples in Patent Document 2, an example of forming an adhesive layer which contains carbon black in the adhesive at 3 wt % and has a thickness of 10 μm is disclosed.

Patent Document 1: Japanese Unexamined Patent Application, Publication No. 2012-59867

Patent Document 2: Japanese Unexamined Patent Application, Publication No. 2015-12206

Field of the Invention

The present invention relates to a substrate for light emitting elements and a module.

SUMMARY OF THE INVENTION

In the case the adhesive layer containing a light shielding member as in the substrate for light emitting element disclosed in Patent Document 2, there is a limit to the thickness of the adhesive layer and the content of the light shielding member and thus light is insufficiently shielded and degradation of the substrate cannot be effectively prevented. First, the limit to the thickness of the adhesive layer is about 10 μm, as it is apparent from the above description of the Examples, and the adhesive layer undergoes cohesive failure when the thickness is thicker than this so that the adhesive property decreases. In addition, the adhesive function is inhibited by the contained filler, thus the amount of light shielding member to be contained is also limited to several wt % as in the Examples described above, and the adhesive property to the resin base material greatly decreases when the content is more than this so that peeling off at the interface between the adhesive layer and the resin base material occurs.

As described above, it is impossible to sufficiently shield the light, particularly blue light from the light emitting element by containing a light shielding member in the adhesive layer, and as a result, degradation of the substrate occurs.

In view of the above problems, an object of the present invention is to provide a substrate for a light emitting element that exhibits excellent light resistance to the light from the light emitting element while maintaining the adhesive strength of the adhesive layer to bond the metal wiring portion in a preferred range.

The present inventors have carried out intensive investigations and, as a result, have found that the above problem can be solved by a substrate for a light emitting element having a reflective layer between the resin substrate and the adhesive layer, thereby completing the present invention.

(1) A substrate for light emitting element comprising:
a resin substrate exhibiting flexibility and
a metal wiring portion being formed on at least one surface side of the resin substrate via an adhesive layer, in which
a reflective layer is disposed between the resin substrate and the adhesive layer, in which
the reflective layer contains a thermosetting resin and a light reflective filler, in which
the content of the light reflective filler is 10% by mass or more and 85% by mass or less, and
the reflectance at a wavelength of 450 nm is 80% or more.

(2) The substrate for a light emitting element according to (1), in which the thickness of the reflective layer is 5 μm or more and 250 μm or less.

(3) The substrate for a light emitting element according to (1) or (2), in which the adhesive layer does not contain a light reflective filler or the content of the light reflective filler in the adhesive layer is 40% by mass or less.

(4) A module obtained by mounting a light emitting element onto the substrate for a light emitting element according to any one of (1) to (3).

(5) The module according to (4), in which the light emitting element is a blue light emitting element.

(6) The module according to (4) or (5), in which the peak of the emission wavelength of the light emitting element is 430 nm or more and 470 nm or less.

(7) The module according to any one of (4) to (6), in which an underfill is disposed between the adhesive layer and the light emitting element.

(8) The module according to any one of (4) to (7), in which a sealing member to seal the light emitting element is disposed on the resin substrate, in which the sealing member contains one or more materials selected from an epoxy resin, a modified epoxy resin, a silicone resin, and a modified silicone resin.

The substrate for a light emitting element of the present invention is a substrate for a light emitting element that exhibits excellent light resistance to the light from the light emitting element while maintaining the adhesive strength of the adhesive layer to bond the metal wiring portion in a preferred range.

DETAILED DESCRIPTION OF THE INVENTION

Hereinafter, the respective embodiments of the substrate for the light emitting element, module, and display device of the present invention will be described. The present invention is not limited to the following embodiments in any way, and the present invention can be implemented by adding appropriate modifications within the scope thereof.

<Substrate for a Light Emitting Element>

Figure 1:
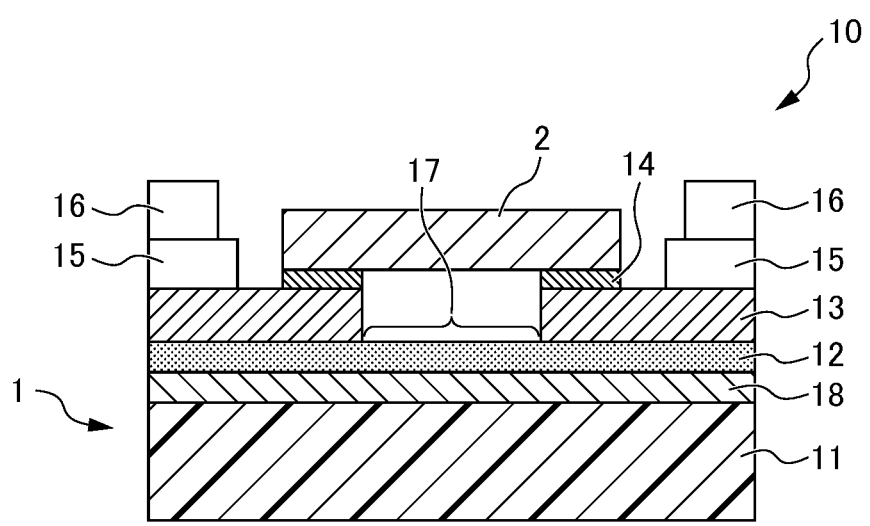
FIG. 1 is a partial cross-sectional diagram of the module of the present invention, and it is a schematic diagram for explaining the mounting method of the light emitting element in the module of the present invention.

The substrate for a light emitting element of the present invention will be described. As illustrated in FIG. 1, in a substrate for a light emitting element 1 according to the present invention, a reflective layer 18 is disposed on the surface of a resin substrate 11 exhibiting flexibility. Moreover, a conductive metal wiring portion 13 consisting of a metal layer or the like is formed on the surface of the reflective layer 18 via an adhesive layer 12. In addition, the substrate for a light emitting element 1 may be one in which the outermost surface is further equipped with a surface reflector 16 as an feature for covering the part except the region in which the light emitting element 2 is mounted.

[Reflective Layer]

The reflective layer 18 is a resin layer that is formed to contain a thermosetting resin and a light reflective filler and exhibits a light reflective property. With respect to the light reflective property of the reflective layer 18, specifically the reflectance at a wavelength of 450 nm may be 80% or more and is preferably 85% or more. It is possible to prevent blue light at a wavelength of about 450 nm, which has high energy and a high risk of damaging the resin substrate among the light from the light emitting element 2, from reaching the resin substrate 11 as the reflectance at a wavelength of 450 nm may be 80% or more and is preferably 85% or more, and this makes it possible to sufficiently decrease the risk of the resin substrate 11 being damaged by the light from the light emitting element 2 by holes being generated or the like. Incidentally, the reflectance at the wavelength of 450 nm can be determined by the reflectance (%) of light when the light enters, for example, by a measuring method conforming to JIS K7375-2008 (plastic: total light transmittance and total light reflectance) using an ultraviolet-visible spectrophotometer (ultraviolet-visible spectrophotometer UV-2550 manufactured by Shimadzu Corporation).

In addition, the reflective layer 18 contains a thermosetting resin as a main resin and a light reflective filler, such as various kinds of white pigment, to be described below, in a predetermined amount range. In order to set the reflectance of the reflective layer 18 at the wavelength of 450 nm to 80% or more and preferably 85% or more, the content of the light reflective filler in the reflective layer 18 may be 10% by mass or more and 85% by mass or less and is more preferably 30% by mass or more and 85% by mass or less. It is possible to use at least one or more kinds of pigment selected from white pigments such as titanium oxide, aluminum oxide, silicon oxide, titanium oxide, magnesium oxide, antimony oxide, aluminum hydroxide, barium sulfate, magnesium carbonate, barium carbonate, or a glass filler as the light reflective filler to be contained in the reflective layer 18. In addition, it is possible to most preferably use titanium oxide having a refractive index of about 2.5 among these from the viewpoint of it being more preferable as the difference in refractive index between the light reflective filler and the main resin is greater.

Examples of the thermosetting resin to be used in the reflective layer 18 may include a mixture of a fluorine resin with an acrylic resin, a silicone resin, and an epoxy resin. The thermosetting resin tightly adhered to the adhesive layer 12 is preferably one that has a high glass transition temperature (TG).

Examples of the fluorine resin to be used in the mixture of a fluorine resin with an acrylic resin may include a copolymer of tetrafluoroethylene with a hydroxyl group-containing vinyl ether and a copolymer of chlorotrifluoroethylene with a hydroxyl group-containing vinyl ether. Among these, a copolymer of chlorotrifluoroethylene with a hydroxyl group-containing vinyl ether is suitably used. Examples of such a resin may include a copolymer of chlorotrifluoroethylene with diethylene glycol monoallyl ether and vinyl butyrate, which has a mass average molecular weight of 1,000 or more and 30,000 or less and a hydroxyl group value of 5 mg/g or more and 200 mg/g or less.

Examples of the acrylic resin to be used in the mixture of a fluorine resin with an acrylic resin may include those obtained by copolymerizing an acrylic compound having a hydroxyl group such as 2-hydroxyethyl acrylate, 2-hydroxypropyl acrylate, 2-hydroxy-3-phenoxypropyl acrylate with acrylic acid or an alkyl acrylate-based monomer having a methyl group, an ethyl group, an n-propyl group, an i-propyl, an n-butyl group, an i-butyl group, a t-butyl group, a 2-ethylhexyl group, a cyclohexyl group, or the like as an alkyl group. In addition, as the monomer to be used for the copolymerization, an amide group-containing monomer such as acrylamide, N-alkylacrylamide, N,N-dialkylacrylamide (examples of the alkyl group may include a methyl group, an ethyl group, an n-propyl group, an i-propyl group, an n-butyl group, an i-butyl group, a t-butyl group, a 2-ethylhexyl group, and a cyclohexyl group), N-alkoxymethylacrylamide, N,N-dialkoxyacrylamide (examples of the alkoxy group may include a methoxy group, an ethoxy group, a butoxy group, and an isobutoxy group), N-methylolacrylamide, or N-phenylacrylamide, a glycidyl group-containing monomer such as glycidyl acrylate or allyl glycidyl ether, and various kinds of compounds having an ethylenically unsaturated bond such as styrene, α-methylstyrene, vinyl methyl ether, vinyl ethyl ether, maleic acid, alkyl maleic acid monoesters, fumaric acid, alkyl fumaric acid monoesters, itaconic acid, alkyl itaconic acid monoesters, acrylonitrile, vinylidene chloride, ethylene, propylene, vinyl chloride, vinyl acetate, and butadiene may be further used. Among these, a copolymer of methyl acrylate with 2-ethylhexyl acrylate and a copolymer of methyl acrylate with 2-ethylhexyl acrylate and hydroxyethyl acrylate are preferably used. In addition, examples of the preferred mass average molecular weight of such a resin may include 1000 or more and 300,000 or less.

The reflective layer 18 can be formed, for example, by coating and drying a coating liquid containing these resins and a curing agent. For example, it can be formed by curing the coating liquid through the reaction of a resin compound having a plurality of crosslinkable substituents with a polyisocyanate compound having an NCO group.

The thickness of the reflective layer 18 is preferably 5 μm or more and 250 μm or less, more preferably 10 μm or more and 100 μm or less, and even more preferably 20 μm or more and 50 μm or less. It is not preferable that the thickness of the reflective layer 18 be less than 5 μm since the reflective layer 18 cannot sufficiently follow the deformation of the resin substrate 11 exhibiting flexibility but peels off or is chipped in some cases. On the other hand, when the thickness of the reflective layer exceeds 250 μm, it is difficult to maintain sufficient flexibility of the substrate for a light emitting element 1 and it is also a concern that a decrease in handling ability is caused due to the increase in weight.

The reflective layer 18 described above has a reflectance at a wavelength of 450 nm of 80% or more. Hence, the substrate for a light emitting element 1 equipped with this is particularly useful as a substrates for a blue light emitting element.

[Resin Substrate]

The resin substrate 11 is not particularly limited as long as it is a film or sheet exhibiting flexibility, but a thermoplastic resin is preferably used. The term "it exhibits flexibility" in this specification refers to that "it is able to be bent so as to have a curvature radius of usually 1 m, preferably 50 cm, more preferably 30 cm, even more preferably 10 cm, and even more preferably 5 cm".

However, the material for the resin substrate 11 is required to be one that exhibits a predetermined heat resistance and insulating property corresponding to the intended use. As such a resin, it is possible to use a polyimide resin (PI) or polyethylene naphthalate (PEN) which exhibits excellent heat resistance, dimensional stability at the time of heating, mechanical strength, and durability. Among them, it is possible to preferably use polyethylene naphthalate (PEN) the heat resistance and dimensional stability of which are improved by being subjected to a heat resistance improving treatment, such as an annealing treatment. In addition, polyethylene terephthalate (PET), of which the flame retardancy is improved by the addition of a flame retardant inorganic filler, can also be selected as the material for the resin substrate 11.

It is preferable to use those materials as the resin substrate 11 that have a heat shrinkage starting temperature of 100° C. or higher or those materials the heat resistance of which is improved by the above-mentioned annealing treatment or the like so as to have a heat shrinkage starting temperature of 100° C. or higher. Usually, the temperature of the peripheral portion of the light emitting element reaches about 90° C. due to the heat generated from the element. From this point of view, the thermoplastic resin to form the substrate resin is preferably one that exhibits heat resistance to a temperature equal to or higher than the above temperature.

Incidentally, the term "heat shrinkage starting temperature" in this specification refers to the temperature that is obtained as follows: a sample film composed of a thermoplastic resin of the measurement target is set in a TMA device, a load of 1 g is applied thereto, the temperature is raised to 120° C. at a temperature rising rate of 2° C./min, the amount of shrinkage (represented by %) at that time is measured, the temperature that is separated from the baseline having an amount of shrinkage of 0% is read from the graph on which the temperature and the amount of shrinkage are recorded by outputting this data, and this temperature is adopted as the heat shrinkage starting temperature. In addition, the term "thermal curing temperature" in this specification refers to the temperature that is obtained as follows: the temperature at the point when the heat curing reaction initiates when a thermoplastic resin of the measurement target is heated is measured and calculated and this temperature is adopted as the thermal curing temperature.

In addition, the substrate for a light emitting element 1 is required to be a resin exhibiting an insulating property that can impart the insulating property required for a substrate for a light emitting element, for example, when being integrated as a backlight or the like of an LED display device. In general, the specific volume resistivity of the substrate is preferably $10^{14}$ Ω·cm or more and more preferably $10^{18}$ Ω·cm or more. Incidentally, the measurement of the specific volume resistivity can be conducted by using, for example, the digital ultra-high resistance/micro-current meter 5450/5451 manufactured by the ADC CORPORATION.

The thickness of the resin substrate is not particularly limited, but it is preferably generally about 10 μm or more and 100 μm or less from the viewpoint of the balance between heat resistance and insulating property and manufacturing cost in the case of a resin substrate exhibiting flexibility. In addition, the thickness is preferably in the above range from the viewpoint of maintaining favorable productivity when the substrate is manufactured by a roll-to-roll method as well.

[Adhesive Layer]

The formation of the metal wiring portion 13 on the surface of the reflective layer 18 is preferably conducted by a dry lamination method via the adhesive layer 12. It is preferable that a light reflective filler is not contained in the adhesive layer 12 or the content of the light reflective filler be 40% by mass or less when it is contained in the adhesive layer 12. In addition, the adhesive layer 12 is preferably a light-transmissive thin film layer which transmits 85% or more of the total visible light. It is possible to appropriately use a known resin adhesive as the adhesive to form such an adhesive layer 12. Among these resin adhesives, a urethane-based adhesive, polycarbonate-based adhesive, an epoxy based adhesive, or the like can be particularly preferably used.

It is preferable that the adhesive layer 12 does not contain a light reflective filler from the viewpoint of adhesive strength, but it may be one which contains a light reflective filler in the above range. This makes it possible to decrease the light which reaches the resin substrate 11 while maintaining the adhesive strength of the adhesive layer 12 in the required range. It is possible to use various kinds of white pigment as the light reflective filler which can be contained in the adhesive layer 12, such as titanium oxide, which are the same as those which can be contained in the reflective layer 18.

[Metal Wiring Portion]

The metal wiring portion 13 is a wiring pattern formed by a conductive base material such as a metal layer or the like. The metal wiring portion 13 is formed in a shape so that the light emitting element 2 can be mounted between one part of the metal wiring portion 13 and another part of the metal wiring portion 13 that is formed apart from the one portion as illustrated in FIG. 1. Incidentally, in such a substrate for a light emitting element 1, there is a part at which the metal wiring portion 13 is not formed in the region that is assumed to have the light emitting element 2 mounted therein on the surface of the resin substrate 11. The region that is the region assumed to have the light emitting element 2 mounted therein and the horizontal region in which the metal wiring portion 13 is not present is referred to as a metal wiring portion absent region 17 in the substrate for a light emitting element 1. In the substrate for a light emitting element 1, it is essential that the reflective layer 18 is formed at least in this metal wiring portion absent region 17.

The disposition of the metal wiring portion 13 is not limited to a particular disposition and the like as long as it is a disposition by which the light emitting element 2 can be mounted. However, in the substrate for a light emitting element 1, it is preferable that at least a proportion of 80% or more, preferably 90%, and more preferably 95% or more of one surface of the substrate is covered with the metal wiring portion 13. This can contribute to the improvement of heat dissipation required for the substrate for a light emitting element 1 in which the metal wiring portion 13 is formed.

The thermal conductivity λ of the metal constituting the metal wiring portion 13 is preferably 200 W/(m·K) or more and more preferably 300 W/(m·K) or more. The electrical resistivity R of the metal constituting the metal wiring portion 13 is preferably $3.00 \times 10^{-8}$ Ω·m or less and more preferably $2.50 \times 10^{-8}$ Ω·m or less. Here, for example, the thermal conductivity meter QTM-500 manufactured by KYOTO ELECTRONICS MANUFACTURING CO., LTD. can be used for measuring thermal conductivity λ, and, for example, the 6517B Electrometer manufactured by KETRONIX, INC. can be used for measuring the electrical resistivity R. According to this, for example, the thermal conductivity λ is 403 W/(m·K) and the electrical resistivity R is $1.55 \times 10^{-8}$ Ω·m in the case of copper. This makes it possible to achieve both the heat dissipation and electrical conduction properties. More specifically, the heat dissipation from the light emitting element 2 is stabilized and an increase in electrical resistance is prevented, thus the variation in light emission among the light emitting elements decreases, and stable light emission by the light emitting element is possible, and the lifespan of the light emitting element is also extended. Furthermore, degradation of peripheral members, such as the substrate, by heat can also be prevented, and thus the product lifespan of the image display device itself into which the substrate for light emitting element 1 is incorporated as a backlight can also be extended.

Incidentally, the surface resistance value of the metal wiring portion 13 is preferably 500 Ω/□ or less, more preferably 300 Ω/□ or less, even more preferably 100 Ω/□ or less, and even more preferably 50 Ω/□ or less. The lower limit thereof is about 0.005 Ω/□.

Examples of the metal to be used as the material for the metal wiring portion 13 may include metal layers of aluminum, gold, silver, copper, and the like. The thickness of the metal wiring portion 13 may be appropriately set depending on the magnitude of the withstand current required for the substrate for a light emitting element or the like, and it is not particularly limited, but examples thereof may include a thickness of 10 μm or more and 50 μm or less. The thickness of the metal wiring portion 13 is preferably 10 μm or more from the viewpoint of improvement in heat dissipation. In addition, when the thickness of the metal wiring portion 13 is less than the above lower limit value, the influence of thermal shrinkage of the substrate increases, warpage after the treatment is likely to be great at the time of the solder reflow treatment, and thus the thickness of the metal wiring portion 13 is preferably 10 μm or more from this point of view as well. It is possible to maintain sufficient flexibility and also to prevent a decrease in handling ability due to an increase in weight as the thickness is 50 μm or less.

[Solder Layer]

In the substrate for a light emitting element, it is preferable to conduct bonding via a solder layer 14 for bonding between the metal wiring portion 13 and the light emitting element 2. This bonding by solder can be conducted, for example, by a reflow method or a laser method.

[Insulating Protective Film]

An insulating protective film 15 is not an essential constituent requirement in the present invention, but it is formed at the part apart from the part at which electrical bonding of the metal wiring portion 13 onto the surface of the substrate for light emitting element is required by using a heat-curable ink, a UV curable ink, or a coverlay film mainly in order to improve the migration resistance property of the substrate for a light emitting element as described above in the case of providing the insulating protective film.

It is possible to appropriately preferably use a known ink as the heat-curable ink as long as it has a heat curing temperature of about 100° C. or lower. Specifically, insulating inks which respectively contain a polyester-based resin, an epoxy-based resin, an epoxy-based and phenolic resin, an epoxy acrylate resin, a silicone resin, and the like as the base resin may be mentioned as a representative example of the ink which can be preferably used. In addition, among these, a polyester-based heat-curable insulating ink is particularly preferable as the material for forming the insulating protective film 15 of the substrate for light emitting element 1 from the viewpoint of exhibiting excellent flexibility.

In addition, the heat-curable ink or UV curable ink for forming the insulating protective film 15 may be, for example, a white ink which further contains an inorganic white pigment such as titanium dioxide. By whitening the insulating protective film 15, it is possible to achieve an improvement in reflective property and design.

Incidentally, the formation of the insulating protective film 15 by the insulating heat-curable ink described can be conducted by a known method, such as screen printing.

In the case of using a coverlay film, for example, the insulating protective film 15 can be formed by coating an adhesive on a resin film exhibiting high heat resistance, such as a polyimide resin and pasting it on the resin substrate 11.

[Surface Reflector]

As illustrated in FIG. 1, the substrate for light emitting element 1 may be one that is further equipped with a surface reflector 16. The surface reflector 16 is laminated onto the outermost surface of the light emitting surface side of the substrate for a light emitting element 1 except onto the part at which the light emitting element 2 is mounted if necessary for the purpose of improving the light emitting capability in the module 10 to be described in detail later. The surface reflector 16 is not particularly limited as long as it is a member having a reflecting surface which reflects the light emitted from the light emitting element and directs it to a predetermined direction, but it is possible to appropriately use a white polyester of a white polyester foam type, a white polyethylene resin, silver deposited polyester, or the like depending on the application, required specifications, and the like of the end product.

[Light Emitting Element]

The light emitting element 2 is disposed on the substrate for a light emitting element 1. The light emitting element 2 has a pair of electrodes on one surface, and it is electrically connected to the metal wiring portion 13 via the pair of electrodes. The shape, size, and the like of the light emitting element 2 to be used here are not particularly limited. As the luminescent color of the light emitting element 2, a color having an arbitrary wavelength can be selected depending on the application, but a light emitting element which emits blue light can be used. The blue light emitting element means a light emitting element capable of emitting light having a wavelength of 430 nm or more and 500 nm or less but, for example, it is preferable to use a light emitting element which has its peak emission wavelength at 430 nm or more and 470 nm or less and emits blue light. It is possible to use a GaN-based or InGaN-based light emitting element as the light emitting element 2. $In_XAl_YGa_{1-X-Y}N$ ($0 \leq X \leq 1$, $0 \leq Y \leq 1$, and $X+Y<1$) and the like can be used as the InGaN-based light emitting element 2.

[Underfill]

Figure 4:
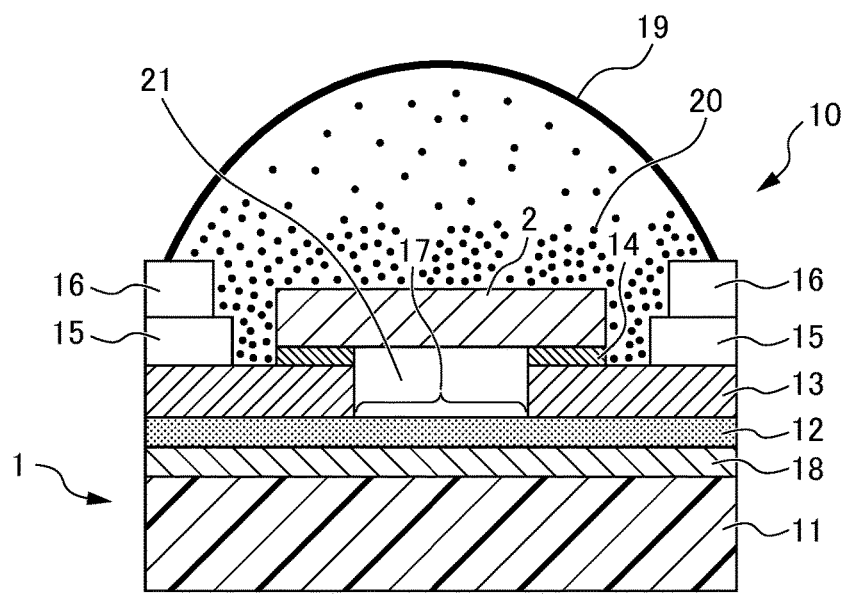
FIG. 4 is a partial cross-sectional diagram of the module of another embodiment of the present invention.

FIG. 4 is a partial cross-sectional diagram of the module of another embodiment of the present invention. It is also possible to dispose an underfill 21 between the adhesive layer 12 and the light emitting element 2 as the module of the embodiment illustrated in FIG. 4. The underfill 21 can enhance the bonding strength between the adhesive layer 12 and the light emitting element 2. The underfill 21 is preferably a thermosetting resin such as an epoxy resin or a silicone resin. In addition, the underfill 21 is preferably a material which enhances the bonding strength thereof with the adhesive layer 12, and it is preferable to use the same kind of material in the underfill 21 and the adhesive layer 12, but different materials may also be used.

[Sealing Member]

It is preferable that a sealing member 19 to seal the light emitting element 2 is disposed on the resin substrate 11. This is because it is possible to protect the light emitting element 2 from dust or moisture. The sealing member 19 is preferably an epoxy resin, a modified epoxy resin, a silicone resin, or a modified silicone resin.

[Phosphor]

The sealing member 19 may contain a phosphor 20. The phosphor 20 is a material that absorbs the light from the light emitting element 2 and emits light having a different wavelength, and it emits light in green, yellow, red, or the like. As the phosphor 20, it is possible to use an oxide phosphor such as YAG or silicate, a nitride phosphor such as CASN or SCASN, a fluoride phosphor such as KSF, and the like.

<Method for Manufacturing Substrate for Light Emitting Element>

The method for manufacturing the substrate for a light emitting element 1 is not particularly limited. The substrate for a light emitting element 1 can be appropriately manufactured by a method for manufacturing an electronic substrate known in the prior art. The substrate for a light emitting element 1 can be manufactured, for example, through an etching step to be described below. In addition, it is preferable to subject the resin to a heat resistance improving treatment by an annealing treatment in advance depending on the material resin to be selected.

[Annealing Treatment]

Although it is not essential in the present invention, it is possible to use a heat treatment means known in the prior art in the case of conducting the annealing treatment. An example of the temperature for the annealing treatment is a range of from the glass transition temperature to the melting point, more specifically a range of from 160° C. to 260° C., and more preferably a range of from 180° C. to 230° C. in a case in which the resin substrate is PEN. As the time for the annealing treatment, a time of about from 10 seconds to 5 minutes can be exemplified. According to such heat treatment conditions, the heat shrinkage starting temperature of PEN, which is generally about 80° C., can be improved to about 100° C.

[Etching Step]

It is possible to obtain a laminate to be the material for the substrate for a light emitting element by laminating the metal wiring portion 13 of the metal layer to be the material for the metal wiring portion onto the surface of the resin substrate subjected to the annealing treatment. Examples of the lamination method may include a method to bond the metal layer onto the surface of the resin substrate with an adhesive. From the viewpoint of cost or productivity, a method to bond the metal layer onto the surface of the resin substrate with a urethane-based adhesive is advantageous.

Next, an etching mask patterned in the shape of the metal wiring portion 13 is formed on the surface of the metal layer of the laminate. The etching mask is provided so as to prevent the wiring pattern formed part of the metal layer, later to be the metal wiring portion 13, from being corroded by the etchant. The method for forming the etching mask is not particularly limited, and for example, when using a photoresist or a dry film, the etching mask may be formed on the surface of the laminated sheet by developing the photoresist or the dry film after exposing it to light through a photomask, or the etching mask may be formed on the surface of the laminated sheet by a printing technique such as using an ink-jet printer.

Next, the metal layer at the place which is not covered with the etching mask is removed by using an immersion liquid. By this, the part other than the place to be the metal wiring portion 13 in the metal layer is removed.

Finally, the etching mask is removed by using an alkaline stripping solution. By this, the etching mask is removed from the surface of the metal wiring portion 13.

[Insulating Protective Film and Surface Reflector Forming Step]

The insulating protective film 15 and the surface reflector 16 are further laminated if necessary after the metal wiring portion is formed. The lamination of these can be conducted by a known method. It is possible to use a printing method such as screen printing or various kinds of lamination methods such as dry lamination or a heat lamination method depending on the material to be employed.

<Module>

The module 10 can be obtained by mounting the light emitting element 2 on the substrate for a light emitting element 1 described above.

The method for manufacturing the module 10 using the substrate for a light emitting element 1 will be described. The bonding of the light emitting element 2 to the metal wiring portion 13 can be preferably conducted by a soldering process. This bonding by solder can be conducted by a reflow method or a laser method. The reflow method is a method in which the light emitting element 2 is mounted on the metal wiring portion 13 via solder, thereafter the substrate for light emitting element is transported into a reflow furnace, hot air at a predetermined temperature is blown onto the metal wiring portion 13 in the reflow furnace to melt the solder paste, and the light emitting element 2 is soldered to the metal wiring portion 13. In addition, the laser method is a method for soldering the light emitting element 2 to the metal wiring portion 13 by locally heating the solder with a laser. Incidentally, Sn—Bi-based solder, Sn—Cu-based solder, and Sn—Ag—Cu-based solder may be used as the solder material in accordance with the heat resistance of the resin substrate 11.

It is preferable to use a method to conduct the reflow of solder through laser irradiation from the back surface side of the substrate for a light emitting element 1 when the solder bonding of the light emitting element 2 to the metal wiring portion 13 is conducted. This makes it possible to more reliably suppress the ignition of the organic components of the solder by heating and the damage to the substrate associated with this.

<Display Device>

Figure 2:
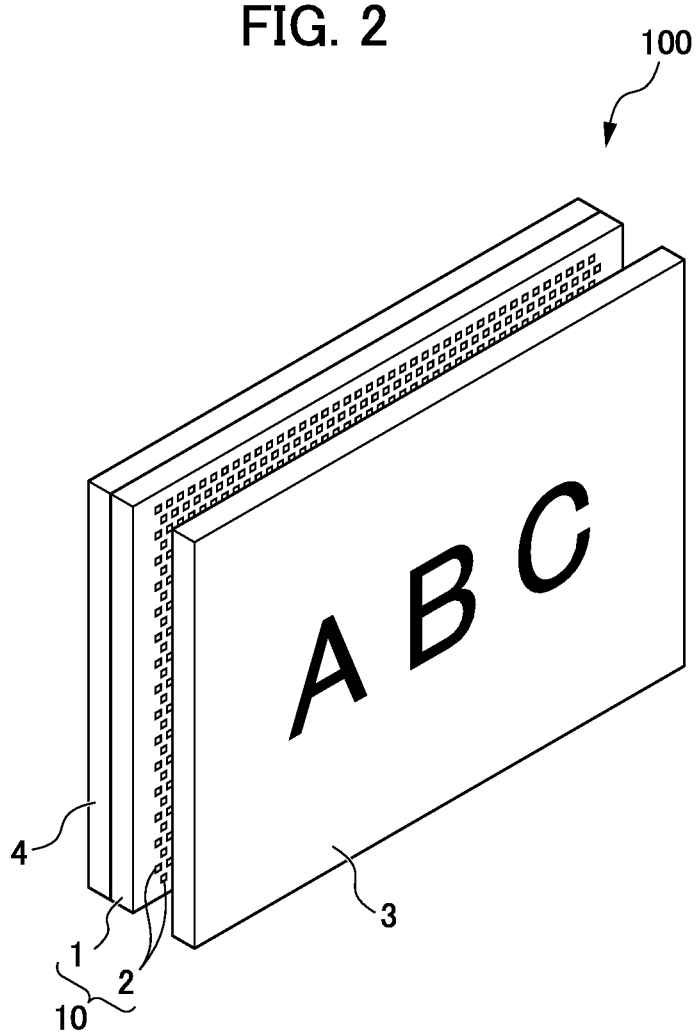
FIG. 2 is a perspective diagram that schematically illustrates the outline of the layer configuration of an image display device using the module of the present invention.

FIG. 2 is a perspective diagram schematically illustrating the outline of the layer configuration of an image display device 100 using the module 10. The display device 100 displays information (image) such as characters or video on a monitor 3 by driving (light emission) the light emitting element 2 such as a plurality of LED elements arranged in a matrix shape at a predetermined interval. The light emitting element 2 is mounted on the metal wiring portion 13 of the substrate for a light emitting element 1. In addition, it is even more preferable that a heat dissipation structure 4 for even more efficiently radiating the heat dissipated from the module 10 to the outside is installed on the back surface side of the resin base material. By using the module 10 of the present invention, it is possible to manufacture a large-sized display device having a screen size (length of the diagonal line) of 65 inches or more at a lower cost than in the prior art, and the manufactured display device exhibits improved quality stability.

<Effect of Substrate for Light Emitting Element>

The degradation of the resin substrate composed of a resin base material is likely to be promoted by the light from the light emitting element, by blue light, which has a short wavelength and high energy among the colors of light. In contrast, the substrate for a light emitting element 1 has an excellent effect of being able to effectively shield blue light from the light emitting element 2 while maintaining the adhesive strength of the adhesive layer 12 as it has a configuration in which the resin substrate 11, the reflective layer 18 having a high reflectance so that the reflectance thereof at a wavelength of 450 nm is 80% or more, and the adhesive layer 12 are laminated in this order. In addition, the substrate for a light emitting element 1 further has the following effects in addition to this.

First, the reflection occurs not only on the reflective layer 18 but also on the adhesive layer 12 having a predetermined refractive index by forming the layer configuration on the resin substrate 11 as a double layer configuration of the reflective layer 18 and the adhesive layer 12, and thus it is possible to improve the reflectance by forming multiple layers. From this point of view, a polycarbonate resin (n=1.59) or an epoxy resin (n=1.55 or more and 1.612 or less) is preferably used as compared to a urethane resin (n=1.43) as the resin constituting the adhesive layer from the viewpoint of a high refractive index (namely high reflectance), and this makes it possible to further improve the reflectance.

Incidentally, there is a case in which defects such as wrinkles are generated by the heat (for example, about 150° C. in a case in which the resin substrate 11 is PET) generated at the time of solder bonding for mounting the light emitting element 2 when there is a difference in thermal shrinkage rate between the reflective layer 18 and the adhesive layer 12, and thus the difference in thermal shrinkage rate (JIS K7133, 150° C. ×30 min) between the reflective layer 18 and the adhesive layer 12 is preferably 10% or less.

EXAMPLES

Hereinafter, the present invention will be described in more detail with reference to Examples, but the present invention is not limited to the following Examples.

<Fabrication of Test Sample>

The test sample for confirming the effect of the substrate for a light emitting element of the present invention was fabricated by using the following respective materials.

[Resin Substrate]

The following two kinds of resin film were prepared as the resin substrate for fabricating the samples of Examples and Comparative Examples, and each of them was properly used for each sample as described in the following Table 1. Resin film A: 50 μm polyethylene terephthalate resin film ("QF grade" manufactured by TEIJIN LIMITED). This resin film A is a PEN film of the special grade subjected to a treatment to improve the flame retardancy in particular. Resin film B: 50 μm polyethylene terephthalate resin film ("Teonex" manufactured by TEIJIN LIMITED). This resin film B is a PEN film of the general grade, which had high transparency and was used for general purposes.

[Reflective Layer]

Figure 3:
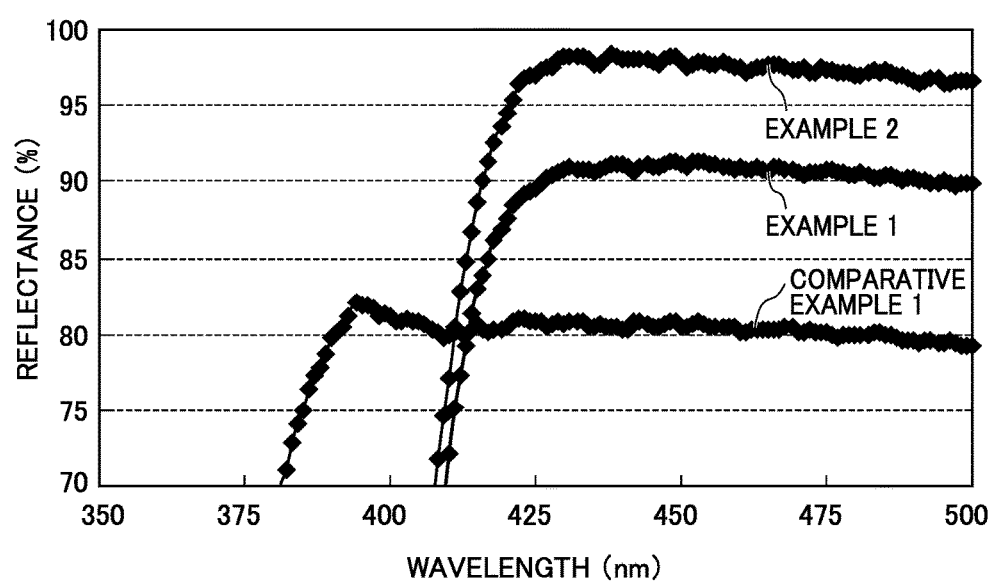
FIG. 3 is a graph that illustrates the measurement results of the transmittance in Examples 1 and 2 and Comparative Example 1.

The following three kinds of coating liquid were formulated as the coating liquid for forming the reflective layer, and each of them was properly used for each sample as described in the following Table 1. Coating liquid A: titanium oxide (product name: R-5N manufactured by SAKAI CHEMICAL INDUSTRY CO., LTD., average particle size: 0.25 μm, treated with alumina) as a light reflective filler was added to a mixed resin of a fluorine resin having a plurality of crosslinkable substituents (ZEFFLE: manufactured by DAIKIN INDUSTRIES, LTD., product name: GK-570) and an acrylic resin (mass average molecular weight of 50,000, Tg: 40° C., hydroxyl group value: 8.9 mg/g) having a plurality of crosslinkable substituents so as to be 30 parts by mass with respect to 100 parts by mass of the resin, namely, it was added so that the content of the light reflective filler in the reflective layer after being cured became 23.1% by mass. In addition, a mixed liquid of ethyl acetate:butyl acetate =1:1 was used as the solvent. The resin main compound was adjusted to a ratio of fluorine resin:acrylic resin=1:3. The solid concentration of the main compound was set to 43% by mass or more and 45% by mass or less. This mixture was stirred for 60 minutes by using a paint shaker. In addition, hexamethylene diisocyanate (HDI) and isophorone diisocyanate (IPDI) were adjusted so as to have a NCO/OH ratio of 1.0, and this was used as the curing agent in each coating liquid. These main compounds and the curing agent were mixed immediately before use (coating)

to obtain the coating liquid A. The reflective layer of each sample was formed by coating this on each resin film and fabricating a cured film. The amount of the coating liquid A coated was adjusted so that the thickness of the reflective layer of each sample became the film thickness as described in Table 1.Coating liquid B: a polyphenylsiloxane resin (trade name: XE14-C2508 manufactured by Momentive Performance Materials Inc.) and a polydimethylsiloxane resin (trade name: IVSM4500 manufactured by Momentive Performance Materials Inc.) were used, and anatase-type titanium oxide: (trade name: A-950 manufactured by SAKAI CHEMICAL INDUSTRY CO., LTD.), rutile-type titanium oxide (trade name: GTR-100 manufactured by SAKAI CHEMICAL INDUSTRY CO., LTD.), and aluminum oxide (trade name: AES12 manufactured by Sumitomo measurement results of the reflectance at a wavelength of 450 nm for each of Examples and Comparative Examples are presented in Table 1, and the measurement results in the wavelength range of from 375 nm to 500 nm for Examples 1 and 2 and Comparative Example 1 are illustrated in FIG. 3.

<Test of Light Resistance>

For the test of light resistance to the blue light emitting element, the laminate was irradiated with a blue laser (laser diode manufactured by NICHIA CORPORATION, wavelength: 450 nm, output: 0.5 W) from above the reflective layer for Examples 1 to 3 and Comparative Example 2, from above the adhesive layer for Example 4, and from above the resin film for Comparative Example 1, and the time until a hole was generated on the film was measured. The test results are presented in the following Table 1.

TABLE 1

|  | Resin substrate | Coating liquid | Reflective layer Thickness (μm) | Reflective layer Reflectance (%) | Adhesive layer Thickness (μm) | Time required until hole generation |
| --- | --- | --- | --- | --- | --- | --- |
| Example 1 | PEN(A) | A | 20 | 91 | — | 3 hours or longer |
| Example 2 | PEN(A) | B | 40 | 98 | — | 3 hours or longer |
| Example 3 | PEN(B) | A | 20 | 91 | — | 120 minutes |
| Example 4 | PEN(A) | A | 20 | 88 | 10 | 3 hours or longer |
| Comparative Example 1 | PEN(A) | Nothing | — | — | — | 11 minutes |
| Comparative Example 2 | PEN(A) | C | 20 | 60 | — | 45 minutes |

Chemical Co., Ltd.) were added to this so as to be respectively 200 parts by mass with respect to 100 parts by mass of the resin, namely, they were added so that the content of the light reflective filler in the reflective layer after being cured became 80.0% by mass to obtain the coating liquid B. The reflective layer was formed by coating this onto each resin film and fabricating a cured film. The amount of the coating liquid B coated was adjusted so that the thickness of the reflective layer for each example became the film thickness as described in Table 1. Coating liquid C: the coating liquid C was formulated by using the same materials as the coating liquid A. Titanium oxide to be added as a white pigment was added to the coating liquid C so as to be 7 parts by mass with respect to 100 parts by mass of the resin, namely, it was added so that the content of the light reflective filler in the reflective layer after being cured became 6.5% by mass, and the other formulations were the same formulation as the coating liquid A.

[Adhesive Layer]

For the sample of Example 4, an adhesive layer was further formed on the reflective layer. A urethane-based adhesive was used as the adhesive, and this was coated so that the thickness of the adhesive layer became 10 μm.

<Test for Measuring Reflectance>

For each of Examples and Comparative Examples, the reflectance of the reflective layer was measured in each wavelength region. However, for the reflectance of Example 4, the laminate was irradiated with light from above the adhesive layer and the reflectance on the surface of the laminate including the adhesive layer was measured. In addition, for Comparative Example 1, the reflectance of the surface of the resin film itself was measured as a reference value. For the measurement, a ultraviolet-visible spectrophotometer (ultraviolet-visible spectrophotometer UV-2550 manufactured by Shimadzu Corporation) was used. The In Table 1, the time required until hole generation is sufficiently long is confirmed in the case of a resin substrate which has a reflective layer having a reflectance at a wavelength of 450 nm of 90% or more formed on the surface thereof. In addition, by comparing the results for Example 1 with Examples 3 and 4, it can be seen that the results of the reflectance and the effect of preventing hole generation of the reflective layer itself do not substantially fluctuate depending on the kind of the resin substrate the light reflectance on the surface of which is presumed to be different from that of the others. In addition, the influence of the presence or absence of the adhesive layer on the above effect is almost the same as the above. It can be seen that the substrate for a light emitting element of the present invention in which a reflective layer having a reflectance at a wavelength of 450 nm of 80% or more is disposed is a substrate for a light emitting element exhibiting light resistance to the light from the light emitting element by taking the results of Comparative Example 2 into account in addition to this.

What is claimed is:

1. A substrate for a light emitting element, comprising:
a resin substrate exhibiting flexibility;
a reflective layer configured as a single layer, wherein the reflective layer is disposed on a surface of the resin substrate, the reflective layer contains a thermosetting resin and a light reflective filler, content of the light reflective filler in the reflective layer is 10% by mass or more and 85% by mass or less, and reflectance of the reflective layer at a wavelength of 450 nm is 80% or more;
an adhesive layer disposed on a surface of the reflective layer;
a metal wiring portion disposed on a surface of the adhesive layer; and a surface reflector that directly or indirectly covers part of the metal wiring portion, and exposes the adhesive layer and the metal wiring portion, wherein a metal wiring portion absent region is formed between one part of the metal wiring and another part that formed apart from the one part, wherein the metal wiring portion absent region is a horizontal region in which a metal wiring portion is not present, and wherein the adhesive layer is exposed in the metal wiring portion absent region.

2. The substrate for a light emitting element according to claim 1, wherein the thickness of the reflective layer is 5 µm or more and 250 µm or less.

3. The substrate for a light emitting element according to claim 1, wherein the adhesive layer does not contain a light reflective filler or the content of the light reflective filler in the adhesive layer is 40% by mass or less.

4. The substrate for a light emitting element according to claim 1, wherein the surface reflector is disposed on the metal wiring portion via an insulating protective film.

5. The substrate for a light emitting element according to claim 4, wherein the insulating protective film is any one of a thermosetting resin, a UV curable ink, or a coverlay film.

6. The substrate for a light emitting element according to claim 4, wherein the insulating protective film contains an inorganic white pigment.

7. The substrate for a light emitting element according to claim 1, wherein the surface reflector is laminated except onto a part at which a light emitting element is mounted.

8. The substrate for a light emitting element according to claim 1, wherein the surface reflector is any one of a white polyester, a white polyethylene resin, or a silver deposited polyester.

9. The substrate for a light emitting element according to claim 1, wherein the reflective layer is any one of resins selected from: a mixture of a fluorine resin with an acrylic resin; a silicone resin; or an epoxy resin.

10. The substrate for a light emitting element according to claim 1, wherein specific volume resistivity of the resin substrate is $10^{14}$ Ω cm or more.

11. A module obtained by mounting a light emitting element onto the substrate for a light emitting element according to claim 1.

12. The module according to claim 11, wherein the light emitting element is a blue light emitting element.

13. The module according to claim 11, wherein the peak of the emission wavelength of the light emitting element is 430 nm or more and 470 nm or less.

14. The module according to claim 11, wherein an underfill is disposed between the adhesive layer and the light emitting element.

15. The module according to claim 11, wherein a sealing member to seal the light emitting element is disposed on the resin substrate, wherein the sealing member contains one or more materials selected from an epoxy resin, a modified epoxy resin, a silicone resin, and a modified silicone resin.

16. The substrate for a light emitting element according to claim 1, wherein the metal wiring portion is a single metal layer being laminated via the adhesive layer, in an aspect of being exposed from the surface of the reflective layer.

17. The substrate for a light emitting element according to claim 16, wherein the metal wiring portion is a metal layer having a thickness of 10 µm or more and 50 µm or less.

18. The substrate for a light emitting element according to claim 1, wherein a thickness of the resin substrate is 10 µm or more and 100 µm or less.

* * * * *